United States Patent [19]
Chappelow et al.

[11] 4,132,818
[45] Jan. 2, 1979

[54] METHOD OF FORMING DEPOSITS FROM REACTIVE GASES

[75] Inventors: Ronald E. Chappelow, Jericho; Harry J. Hunkele, South Hero, both of Vt.

[73] Assignee: International Business Machines Corporation, Armonk, N.Y.

[21] Appl. No.: 700,988

[22] Filed: Jun. 29, 1976

[51] Int. Cl.$^2$ .............................................. C23C 11/00
[52] U.S. Cl. ................................ 427/248 R; 427/93; 427/94; 427/95; 427/248 A; 427/248 B; 427/248 C; 427/255
[58] Field of Search ........... 427/248 R, 248 A, 248 B, 427/255, 248 C, 93, 95

[56] References Cited

U.S. PATENT DOCUMENTS

| | | | |
|---|---|---|---|
| 3,112,997 | 12/1963 | Benzing et al. | 427/248 R |
| 3,736,169 | 5/1973 | Graham et al. | 427/249 |
| 3,925,146 | 12/1975 | Olsen et al. | 427/248 R |
| 3,958,071 | 5/1976 | Hieber et al. | 427/249 |

*Primary Examiner*—Ronald H. Smith
*Assistant Examiner*—Janyce A. Bell
*Attorney, Agent, or Firm*—Francis J. Thornton

[57] ABSTRACT

This describes an apparatus and method for providing a uniform deposition of a layer from a reactive gas over a large area load by entraining the reactive gas or gases in a carrier gas and sequentially changing the concentration of the reactive gas or gases and the flow rate of the carrier gas as they flow over the load to cause the time integrated deposition rate to be substantially constant over the entire surface of the load, thus depositing a uniformly thick layer over the entire area of the load. These changes in concentration and flow rate shift the center of distribution of the reaction rate across the load such that the time integral of such shifting results in a uniformity of deposition.

6 Claims, 3 Drawing Figures

METHOD OF FORMING DEPOSITS FROM REACTIVE GASES

FIELD OF THE INVENTION

This invention relates generally to a method of forming deposits on substrates, at a given temperature, and more particularly to forming uniform deposits on a large number substrates spread over an extensive area in which a gas mixture containing the elements to be deposited is passed over the substrates and its concentration and flow rate are varied.

DESCRIPTION OF THE PRIOR ART

Uniform distribution of reactants over semiconductor wafers has long been studied and a number of solutions proposed. A paper by P. Parekh et al., appearing in the Sept. 19, 1969 issue of the IEEE, teaches, on page 1509, that during diffusion the uniformity of the concentration of the element being diffused into a multiplicity of slices in a furnace is affected by the concentration, the temperature, and velocity of gases in the systems and the spacing of the wafers.

U.S. Pat. No. 3,316,121 describes an epitaxial deposition system in which the equilibrium of the reaction is altered by adjusting the temperature profile of the furnace with a graded insulation jacket and heater so that the deposition rate can be kept substantially constant along the entire reaction tube.

U.S. Pat. No. 3,831,114 also discusses the providing of a uniform deposition in batch processes by using a symmetrical furnace that assures that all wafers are heated uniformly and that all gases are distributed evenly over the entire batch.

U.S. Pat. No. 3,916,822 teaches that the deposited films can be produced in reactors by positioning the substrate at the upper boundary of the reactant gas zone, by forcing the substrates being coated in a downward direction, by uniformly heating the substrates and the gases and by using a radiation shield.

U.S. Pat. No. 3,922,467 teaches a method of forming a deposit from a gas mixture on a large number of flat substrates in a tubular space with the substrates arranged along the gas flow with increasing spaces between the substrates so that better epitaxial layers can be deposited on the substrates.

SUMMARY OF THE INVENTION

Accordingly it is an object of the invention to provide an improved deposition system in which a large number of semiconductor wafers can be provided with a uniform deposited layer.

It is yet another object of the invention to provide a method for compensation of the depletion of the reactant gas so that each substrate will have a substantially uniform deposition thereon.

These and other objects of the invention are obtained by depositing a layer from a reactant gas entrained in a carrier gas which is passed over a large area load such that the concentration of the reactive gas and the flow rate of the carrier gas can be modified to shift the center of distribution of the reaction rate across the load.

Still another object of the invention is to provide an improved method of vapor deposition for forming a substantially uniform layer over a large area by changing the concentration and flow rates of the reactive gases in a carrier gas mixture such that the center of distribution of the reaction rate is progressively shifted across the load.

The foregoing and other objects, features and advantages of the invention will be apparent from the following more particular description of the preferred embodiment of the invention.

DESCRIPTION OF THE DRAWINGS

The invention will now be described in greater detail with reference to the accompanying drawings in which.

Figure 1:
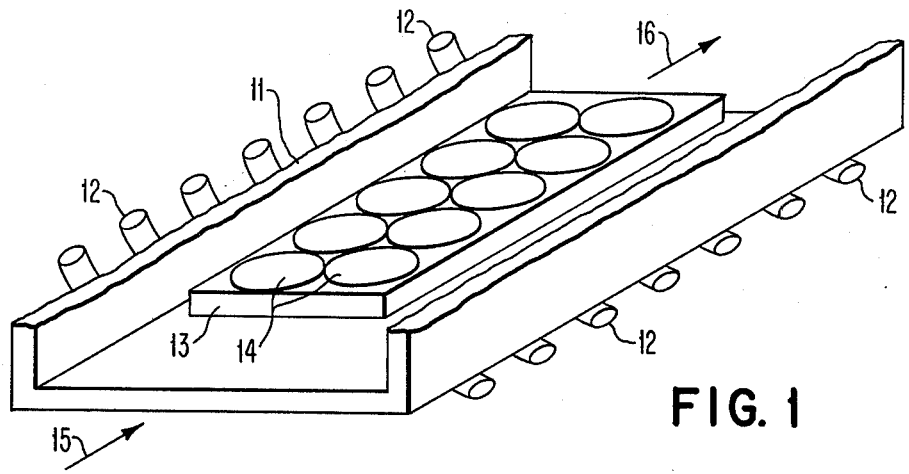
FIG. 1 is a diagrammatic view of the reaction furnace which uses the present invention.

Shown in FIG. 1 is a partially broken diagrammatic view of the horizontal reactor used to practice the invention. In this reactor the gas flow carrying the reactant gas is directed parallel to the wafer surface. In the Fig. there is shown a furnace tube 11 surrounded with a heater element 12 and containing a flat susceptor element 13 upon which a number of work pieces 14 are positioned. Generally the reaction tube 11 is comprised of quartz and typically is approximately 2 inches high, 8 inches wide and 44 inches long. The susceptor 13 is generally made of graphite and is approximately $\frac{1}{4}$ inches high, 5 inches wide and 26 inches long. The work pieces 14, may be, for example, any substrate to be coated such as semiconductor wafers which may be coated with an epitaxial layer, an oxide coating or the like. In most typical furnaces the heater element 12a is a helical RF coil and is used to heat the susceptor which in turn heats the work pieces 14 positioned thereon. Normally to use the reactor to deposit such layers the gas flow is injected at one end of the reactor tube 11 through an inlet port 15. This inlet gas flow is typically a combination of a neutral or reducing carrier gas, such as hydrogen and one or more various reactant gases necessary to form the desired coatings to be deposited upon the workpieces. This input gas flow passes laterally over the work pieces 14 supported by the susceptor 13 and is exhausted through a suitable exit port 16 at the opposite end of the reaction tube 11.

In conventional reactor processing, the rate distribution of the chemical reaction which forms the desired deposit on the work pieces 14 is stationary and time independent. Thus in the region close to the gas inlet the gases become heated almost exclusively by thermal conduction and as the temperature of the gas increases the rate of reaction increases. As this reaction takes place, however, the reactants in the gas flow become depleted causing the reaction rate to diminish. Increases due to gas temperature can only partially compensate for this depletion and the further the distance from the inlet the greater the decrease in rate. Thus the yield of the reaction decreases in the direction of the gas flow and is a result of changes in the concentrations of the reactants in the carrier gas.

Figure 2:
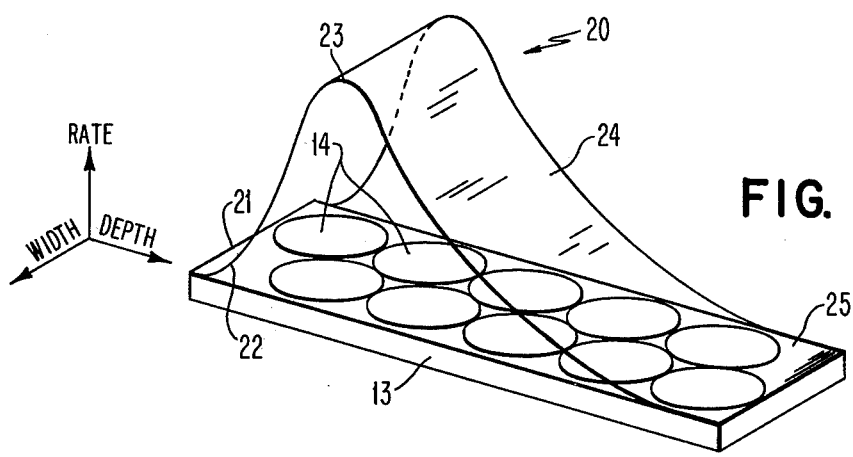
FIG. 2 illustrates a normal deposition rate curve as would be realized by the prior art.

The deposition rate or reaction profile in such reactors varies over the work pieces in a manner similar to the typical distribution curve 20 shown in FIG. 2. This curve comes about in the following manner. As the gases flow over the susceptor 12 they become heated and beginning at the leading edge 21 of the curve 20 the desired reaction begins as shown by the increasing rising portion 22 of the curve 20. As the temperature of the flowing gases increases the reaction rate of the reactants contained therein continues to increase to a peak 23. Now, however, because the reactants in the gas flow have been constantly becoming depleted, the reaction rate begins to fall off as shown by the following portions 24, until the reactants are effectively totally depleted in the gas flow as shown by the trailing edge 25 of curve 20.

Because of this only the work pieces under the peak 23 have substantially uniform deposits thereon and the other work pieces have lesser amounts thereon. This means that any work pieces under the rising portion 21 or the falling portion 24 have a deposit thickness less than the work pieces under the peak 23 and the variation in thickness depends upon their position under the curve. In a test run by the present inventors using such a single curve in the reactor, nonuniformities of about ±12% were realized from work pieces to work pieces in the deposits formed upon the work piece surfaces.

This means that in order for reasonable uniformities to be obtained in such reactors, the susceptor length must be relatively short with a resultant low output. Nonuniformly heated or very high flow carrier gas and high concentration of reactant gases in the gas flow will not satisfactorily compensate for this depletion.

Furthermore, to maintain a precisely graded temperature across the susceptor is extremely difficult and requires special expensive modifications to the reactor. These modifications are usually so expensive that any resultant increases in throughput may be economically unjustified. With higher gas flow rates the rate of deposition or reaction is usually so low that extremely long deposition times are required which also prove to be economically inadvisable.

The present invention avoids all these difficulties by sequentially changing the main carrier gas flow while simultaneously increasing either the reaction time or the concentration of reactant gases in the gas flow or both to cause both form and position modifications of the deposition rate profile shown in FIG. 2.

The present inventors have found that variables such as reaction gas concentration, susceptor temperature, carrier gas flow rate, etc., can be controlled so that the deposition curves can be selectively caused to peak at selected distances along the susceptor and a multiplicity of such curves can be produced in a reactor.

The present inventors have further found that by selective control of these variables the obtained curve can be deformed from the typical curve shown in FIG. 2. Thus if desired the peak 23 of the curve 20 can be made to fall at any selected distance along the susceptor body as will be discussed in conjunction with FIG. 3.

This selective control of the various flow rates, concentration, etc. can thus be used to produce in the reactor a substantially uniform deposition rate over a large area of the susceptor. In this manner the reaction rate profile curve can be progressively moved down the length of the susceptor to provide over the entire area of the susceptor a layer having a uniformity from piece to piece greater than that found in the prior art.

Figure 3:
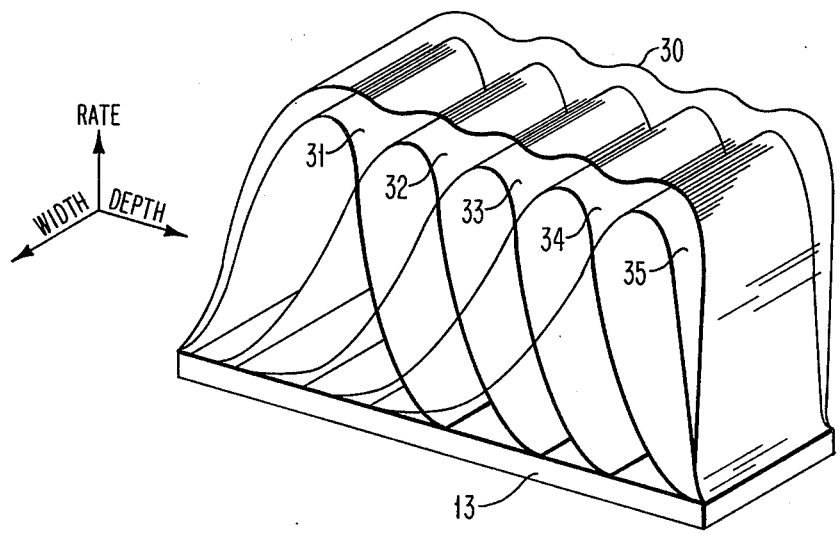
FIG. 3 illustrates the accumulated affect of the various deposition rates when performed in accordance with the present invention.

This resultant uniformity of deposition over the entire susceptor will be more fully appreciated from the following description taken in conjunction with FIG. 3. In this FIG. 3 a number of individual rate profile curves 31, 32, 33, 34 and 35 are caused to be progressively generated in the reactor to result in a broad area uniformity in deposition which is illustrated by the enveloping curve 30. The sequence of these rate profile curves which results in improved uniformity of deposition over the entire susceptor area is as follows and results in an improved rate profile curve 30. This resultant curve 30 is a summation of a plurality of individual rate deposition curves 31 through 35 which have been caused through practice of the invention to have their peaks selectively deployed along the length of the susceptor 13. Although this enveloping curve 30 is shown with distinct ripples these ripples can be eliminated by increasing the number of curves or by modification of the rate of the individual curves by, for example, changes in the carrier gas flow, the reactant gas concentration, the temperature in the susceptor and, etc., to provide smaller differences between the curve peaks. In any case the present invention results in a more adequate and desirable uniformity of deposition over the entire susceptor area as will become apparent from the discussion of the test results which follows. Thus the final deposited layer uniformity over the entire area of the susceptor is indicated by the overall enveloping curve 30 which is the summation curve formed of the additive effect of all of the curves 31, 32, 33, 34 and 35 as shown in FIG. 3.

It should be understood that, while the individual rate curves, 31 through 35 are shown to have the same height and general form in FIG. 3, rate curves having differing or variable heights or shapes may also be summed to yield uniform total thickness distribution 30, within the scope of this invention.

Thus it should now be clear that in the present invention it is necessary to cause one or more of the factors contributing to the deposition rate to vary as functions of time.

It can be shown that in the present invention the deposition rate is:

$$\text{deposit rate } (x,t) \simeq \frac{aCo(t)}{\rho s} \int_z \exp\left[\frac{-a}{V(t)} \int_0^x G(x,z)dx\right]$$

x = distance along susceptor in direction of gas flow
t = time of deposition
a = frequency factor
Co = the inlet concentration of rate limiting reactant in a carrier gas
$\rho s$ = deposited solid density
z = reactor height
V = gas velocity $$G = \exp\left(\frac{-B}{T(x,z)}\right)$$

where
T = temperature and
B = activation energy of the reaction divided by Boltzmann's constant Thus by varying the time functions Co(t) and V(t) the deposition rate can be controlled and the distribution peak of this deposition rate can be caused to move linearly with respect to the distance x.

In the following example the inlet concentration was not deliberately varied and only the gas velocity varied as a function of time.

EXAMPLE 1

A typical run for the production of 1100 Angstrom thick layer of silicon dioxide formed on a silicon semiconductor wafer involved the following parameters when ten silicon semiconductor wafers were evenly distributed over the entire susceptor surface. In this experiment the susceptor temperature was set and held at 1,000° C. ±8° C. over its entire area and a gas flow comprised of hydrogen, carbon dioxide and silane passed over the surface.

Step 1 — The initial gas flow over the described susceptor and wafers comprised 100 liters per minute of hydrogen gas serving as the carrier gas, 5 liters per minute of carbon dioxide and 5cc per minute of silane. This gas flow was passed over the heated wafer surface for 2.8 minutes.

Step 2 — When this time of 2.8 minutes had expired the gas flow was changed to comprise 165 liters per minute of hydrogen, 5 liters per minute of carbon dioxide and 5cc of silane. This mixture was then passed over the susceptor for 3.2 minutes.

Step 3 — At the expiration of the second step the gas flow was again changed to 275 liters per minute of hydrogen, 5 liters per minute of carbon dioxide and 5cc per minute of silane. This third gas flow was passed over the susceptor for 8.2 minutes. At the end of this 8.2 minute period the gas flow was again changed to 100 liter per minute of pure hydrogen and the heater turned off to permit the wafers to cool to room temperature (i.e., about 25° C.).

Once the wafers were cooled to this lowered temperature the thickness of the silicon dioxide layer formed on the surface of the wafer was measured and each wafer was found to have a thickness of silicon dioxide thereon of approximately 1,103 Angstroms ±40 Angstroms. Thus the variation of the silicon dioxide layer formed over the surface of all of the wafers was found to be within ±3.6% of the desired value.

As noted above both the concentration of the reactant and the velocity of the flow can be varied. The following Example II illustrates this.

Other tests were performed to demonstrate the deposition of a uniform layer of silicon nitride on silicon semiconductor wafers placed on the susceptor.

As will be noted in the previous example, one effect due to increasing the flow of hydrogen gas during the deposition is that relatively lengthy intervals are required at the higher flow values, to achieve ultimate uniformity, while this factor may not be objectionable in some cases, as in the previous example, in the present case this effect would lead to excessively long total deposition time intervals, as well as to excessive consumption of costly process gasses.

In cases in which such undesirable effects are of importance, as in the present example, these relatively lengthy deposition intervals can be avoided by varying the reactant concentration, in addition to varying the main gas flow rate as in the previous example.

In the present example, the gas flow was of hydrogen gas, silane and ammonia. The total deposit time was comprised of ten equal intervals, each of 30 seconds duration. During each of these intervals, the flow rates of the gases were varied as shown in Table I.

| DEPOSIT INTERVAL (START/STOP TIME SEC) | HYDROGEN FLOW RATE (LITERS/ MINUTE) | SILANE FLOW RATE (CUBIC CM/ MINUTE) |
|---|---|---|
| 0:00 to 0:30 | 80 | 2.4 |
| 0:30 to 1:00 | 100 | 2.4 |
| 1:00 to 1:30 | 120 | 2.4 |
| 1:30 to 2:00 | 140 | 2.4 |
| 2:00 to 2:30 | 160 | 2.5 |
| 2:30 to 3:00 | 180 | 2.6 |
| 3:00 to 3:30 | 200 | 2.7 |
| 3:30 to 4:00 | 220 | 4.8 |
| 4:00 to 4:30 | 240 | 7.0 |
| 4:30 to 5:00 | 260 | 9.0 |

During the first 30 seconds of the deposition, hydrogen gas was maintained at 80 liters per minute, while the silane flow rate was 2.4 cubic centimeters per minute. During each succeeding 30 second interval, new flow rate values were used for both the hydrogen gas and the silane reactant (which new values coincided with previous values during some intervals). This synchronized variation of both hydrogen and silane was repeated, using appropriate values for the two flows, until, during the final 30 second interval, the final hydrogen flow rate was 260 liters per minute, while the silane flow rate value was 9.0 cubic centimenters per minute. During all of the intervals, ammonia flow rate was held constant at about 7 liters per minute. After completion of the final deposition interval, the flow was changed to 100 liters per minute of pure hydrogen and the heater was turned off, allowing the wafers to cool. After cooling, the thickness of the silicon nitride layers formed on the surfaces of the wafers was measured, and each was found to be approximately 571 Angstroms ±35 Angstroms. Thus the thickness variation in this instance was found to be ±6.3%.

The above examples clearly illustrate that this use of dynamic processing yields a remarkable improvement in layer uniformity.

The above described process can also be implemented using matrix methods, sets of simultaneous equations or even graphic methods especially when several dynamic reactants are being used.

The above process can also be easily implemented emperically without much difficulty. In the simplest case, using only the gas velocity as the dynamic factor the individual thickness profiles as determined at several fixed flow rates; then these various rates are superimposed and weighted with respect to time to make the desired uniform resultant.

Other experiments using different flow rates and reactant compositions have been investigated with the process of the invention showing yield benefits. For example, in addition the oxide and nitride cases described in detail above, low temperature arsenic doped oxide has been deposited and polycrystalline silicon has been grown on suitable work pieces.

By properly utilizing the present invention it has also been found that while thickness uniformity and throughput are thusly maximized, other layer parameters such as etch rate, refractive index and, etc., are maintained within acceptable values.

It is thus clear that important processing advantages can be achieved by utilizing the techniques of the present invention as taught and described above. When compared to conventional processes as presently practiced by the art the invention promises an increase in process yield of almost a factor of 2 and an increase of throughput by approximately the same factor.

It should be noted that although the temperature of the susceptor was described in the above examples as being substantially uniform across its entire surface it need not be so. The inventors have found that the temperature of the susceptor does, however, have to be monotonic across its entire area and relatively accurately controlled.

Therefore, having thus described at least one complete embodiment of the present invention and since other modifications and variations will now become apparent to those skilled in the art it is respectfully requested that the described invention be limited only by the following claims.

What is claimed is:

1. The method of depositing from a gas phase a substantially uniformly thick layer of a solid onto an elongated load wherein a reactive gas, thermally convertible to the solid, is entrained in a carrier gas and passed over and along the surface of the load comprising the steps of:

entraining a reactive gas in a carrier gas, sequentially changing the flow rate of the carrier gas across the load to progressively shift the distribution of the reaction rate across the surface of the load, and simultaneously changing the time said carrier gas, carrying said entrained reactive gas, is flowing over said load, said load being an elongated load and said reactive gas and said carrier gas is passed over on the surface of the load in the direction of the elongation of the load.

2. A method for providing a uniform deposition of a layer from a reactive gas onto the exposed surface of a load comprising the steps of:

entraining a reactive gas in a nonreactive carrier gas, sequentially changing the concentration of the reactive gas in said carrier gas to progressively vary the maximum value of the distribution of the reactive rate, sequentially changing the flow rate of the carrier gas to cause the deposition of the layer on the surface of the load to be substantially constant over the entire surface of an elongated load to deposit a uniform thickness of layer over the entire area of the load, and simultaneously changing the length of time said carrier gas, carrying said entrained reactive gas, is flowing across the load.

3. The method of claim 2 wherein said carrier gas is a neutral nonreactive gas.

4. The method of claim 2 wherein said carrier gas is a reducing gas.

5. The method of depositing a substantially uniformly thick solid from a gas phase onto a plurality of solid substrates wherein a reactive gas, thermally convertible to a solid, entrained in a carrier gas, is passed over and along the surface of each of the substrates, the substrates being positioned in a line extending in the direction of the flow of the gases wherein said deposition reduces the concentration of active reactive elements in the reactive gas, comprising the steps of:

entraining a concentration of a reactive gas in said carrier gas, continuously varying the flow rate of the carrier gas for altering the temperature distribution of the said carrier gas and said reactive gas as they flow over said substrates to maintain the thickness deposition of the active elements from said reactive gas substantially constant over the line of the substrates.

6. The method of depositing a solid from a gas phase onto an elongated load wherein a reactive gas thermally convertible to a solid is entrained in a carrier gas and passed over and along the surface of the load comprising the steps of:

entraining a concentration of a reactive gas in said carrier gas, sequentially changing in steps the flow rate of the carrier gas to progressively shift the distribution of the reaction rate across the surface of the load, and correspondingly changing in steps the length of time said flow rate is maintained to progressively vary the maximum value of the integrated distribution of the reaction rate of said reactive gas.

* * * * *